IMAGE

(12) United States Patent
Shaikevitch et al.

(10) Patent No.: US 7,887,384 B2
(45) Date of Patent: Feb. 15, 2011

(54) TRANSPARENT RING LED ASSEMBLY

(75) Inventors: Alex Shaikevitch, Sunnyvale, CA (US);
Shanquan Bao, Sunnyvale, CA (US);
Michael Solomensky, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/239,451

(22) Filed: Sep. 26, 2008

(65) Prior Publication Data
US 2010/0080006 A1    Apr. 1, 2010

(51) Int. Cl.
*H01J 9/24* (2006.01)
(52) U.S. Cl. ...................................... 445/23
(58) Field of Classification Search ................ 362/800; 257/70–74, E25.032; 438/21, 22, 31–34; 445/23
See application file for complete search history.

(56) References Cited

U.S. PATENT DOCUMENTS

| | | | |
|---|---|---|---|
| 4,883,342 A | 11/1989 | Ishii et al. | |
| 4,966,862 A | 10/1990 | Edmond | |
| 5,317,344 A | 5/1994 | Beaman et al. | |
| 6,053,621 A | 4/2000 | Yoneda | |
| 6,445,007 B1 | 9/2002 | Wu et al. | |
| 6,489,637 B1 | 12/2002 | Sakamoto et al. | |
| 6,599,768 B1 | 7/2003 | Chen | |
| 6,603,243 B2 | 8/2003 | Parkyn et al. | |
| 6,730,939 B2 | 5/2004 | Eisert et al. | |
| 6,809,342 B2 | 10/2004 | Harada | |
| 6,812,500 B2 | 11/2004 | Reeh et al. | |
| 6,834,987 B2 * | 12/2004 | Zynda | 362/487 |
| 6,936,855 B1 | 8/2005 | Harrah | |
| 6,995,510 B2 | 2/2006 | Murakami et al. | |
| 7,078,732 B1 | 7/2006 | Reeh et al. | |
| 7,118,928 B2 * | 10/2006 | Steckl et al. | 438/22 |
| 7,151,283 B2 | 12/2006 | Reeh et al. | |
| 2003/0019934 A1 | 1/2003 | Hunter et al. | |
| 2003/0032212 A1 | 2/2003 | Wang et al. | |
| 2003/0096081 A1 | 5/2003 | Lavallee et al. | |
| 2004/0079957 A1 | 4/2004 | Andrews et al. | |
| 2004/0208210 A1 | 10/2004 | Inoguchi | |
| 2005/0035366 A1 * | 2/2005 | Imai | 257/100 |
| 2006/0124953 A1 | 6/2006 | Negley et al. | |
| 2007/0007558 A1 | 1/2007 | Mazzochette | |
| 2007/0018175 A1 | 1/2007 | Mazzochette et al. | |
| 2007/0090510 A1 | 4/2007 | Tseng et al. | |
| 2007/0170454 A1 | 7/2007 | Andrews | |
| 2007/0176198 A1 | 8/2007 | Lee et al. | |

(Continued)

OTHER PUBLICATIONS

U.S. Appl. No. 12/239,470, filed Sep. 26, 2008, Wei Shi et al.

(Continued)

*Primary Examiner*—Anabel M Ton
(74) *Attorney, Agent, or Firm*—Haynes and Boone, LLP

(57) ABSTRACT

A substrate for an LED assembly can have a plurality of cups formed therein. At least one cup can be formed within another cup. The cups can be co-axial with respect to one another, for example. A machined surface of the substrate can enhance reflectivity of the LED assembly. A transparent and/or non-global solder mask can enhance reflectivity of the LED assembly. A transparent ring can enhance reflectivity of the LED assembly. By enhancing reflectivity of the LED assembly, the brightness of the LED assembly can be increased. Brighter LED assemblies can be used in applications such as flashlights, displays, and general illumination.

10 Claims, 9 Drawing Sheets

U.S. PATENT DOCUMENTS

| | | | |
|---|---|---|---|
| 2008/0019133 A1 | 1/2008 | Kim et al. | |
| 2008/0079017 A1 | 4/2008 | Loh et al. | |
| 2008/0117500 A1 | 5/2008 | Narendran et al. | |
| 2010/0078662 A1* | 4/2010 | Shi et al. | 257/98 |
| 2010/0078663 A1* | 4/2010 | Shi et al. | 257/98 |
| 2010/0079994 A1* | 4/2010 | Shi et al. | 362/241 |

OTHER PUBLICATIONS

U.S. Appl. No. 12/239,494, filed Sep. 26, 2008, Wei Shi et al.
U.S. Appl. No. 12/239,516, filed Sep. 26, 2008, Wei Shi et al.
U.S. Appl. No. 12/239,552, filed Sep. 26, 2008, Wei Shi et al.
PCT Search Report of Nov. 16, 2009 for PCT/US 09/057489.

* cited by examiner

TRANSPARENT RING LED ASSEMBLY

CROSS-REFERENCE TO RELATED APPLICATIONS

This patent application is related to U.S. patent application Ser. Nos. 12/239,470; 12/239,494; 12/239,516; and 12/239,552, all filed on the same date herewith, the entire contents of all of which are expressly incorporated herein by reference.

TECHNICAL FIELD

The present invention relates generally to light emitting diodes (LEDs). The present invention relates more particularly, for example, to methods and systems for packaging LEDs.

BACKGROUND

Light emitting diodes (LEDs) are well known. LEDs are commonly used as indicators on electronic devices. For example, the red or green power indicator on many consumer electronic devices, such as CD and DVD players, is often an LED.

There is a desire to use LEDs in applications such as flashlights, displays, and general illumination. Brighter LEDs are generally required in such applications. However, brighter LEDs require more current and more current results in the production of more heat. Heat reduces the efficiency of LEDs. Further, some of the light from an LED is often wasted, e.g., absorbed, by structures of the LED and/or package therefor.

Thus, although contemporary LEDs have proven generally suitable for some purposes, they possess inherent deficiencies which detract from their overall effectiveness and desirability. Therefore, it is desirable to provide LEDs that can more efficiently use higher current, such as by better managing the heat produced thereby. It is also desirable to provide LEDs that tend to minimize undesirable absorption of light therefrom.

BRIEF SUMMARY

Methods and systems for providing brighter LEDs are disclosed herein. For example, an LED assembly having enhanced reflectivity can waste less light, such as due to absorption of the light by parts of the LED assembly.

According to an example of an embodiment, a substrate assembly for an LED assembly can comprise a substrate and a plurality of cups formed in the substrate. At least one cup can be formed within another cup.

According to an example of an embodiment, an LED assembly can comprise a substrate and a plurality of cups formed in the substrate. At least one cup can be formed within another cup. At least one LED die can be disposed within at least one cup.

According to an example of an embodiment, a method for fabricating an LED assembly can comprise machining a first cup in a substrate and machining a second cup within the first cup. Any desired number of cups can be machined one inside of another.

According to an example of an embodiment, an LED assembly can comprise a transparent solder mask. The transparent solder mask can enhance reflectivity of the substrate (or of material formed upon the substrate).

According to an example of an embodiment, a method for fabricating an LED assembly can comprise forming a transparent solder mask upon a substrate.

According to an example of an embodiment, an LED assembly can comprise a non-global solder mask. For example, the LED assembly can comprise one or more local solder masks.

According to an example of an embodiment, a method for fabricating an LED assembly can comprise forming a non-global solder mask upon a substrate.

According to an example of an embodiment, an LED assembly can comprise a substrate having a machined surface upon which at least one LED die can be attached. The machined surface can be deep enough to define a cup or can be too shallow to define a cup. The machined surface can be deep enough to define a shallow cup. In any instance, the machined surface can be more reflective than a non-machined surface.

According to an example of an embodiment, a method for fabricating an LED assembly can comprise machining a surface of a substrate.

According to an example of an embodiment, an LED assembly can comprise a transparent ring.

According to an example of an embodiment, a method for fabricating an LED assembly can comprise attaching a transparent ring to a substrate.

Thus, brighter LEDs can be provided that are suitable for use in such applications as flashlight, displays, and general illumination.

Embodiments of the present invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
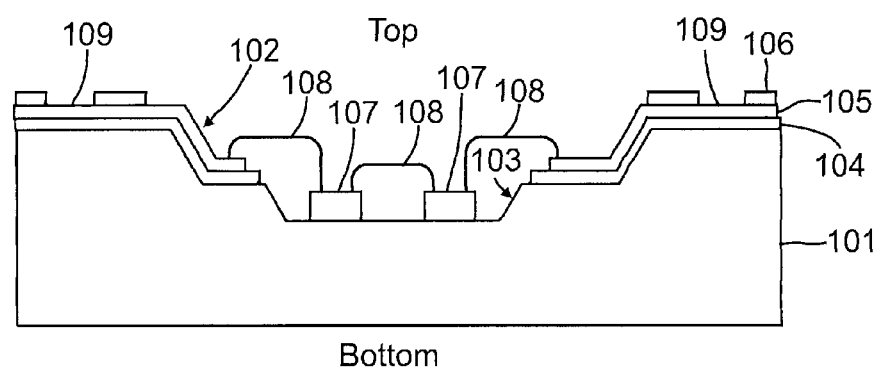
FIG. 1 is a semi-schematic, cross-sectional, side view of a light emitting diode (LED) assembly comprising a plurality of cups (two cups), according to an example of an embodiment.

As examples, methods and systems for packaging light emitting diodes (LEDs) are disclosed. Such methods and systems can provide LED assemblies that are brighter than contemporary LED assemblies. For example, cups having a shiny, machined surface (such as a surface of bare aluminum) can provide optical reflectivity compared to that of silver-plated surfaces, which may be tarnished easily. The use of cups can further facilitate a robust phosphor/silicone dispensing process that provides for increased LED light output and better color quality. Such methods and systems can provide LED assemblies with enhanced heat dissipation, such that more current can be used therewith.

As a further example, such methods and system can provide LED assemblies with mitigated light loss. As those skilled in the art will appreciate, the use of more current in an LED assembly and/or the reduction of light loss in an LED assembly can result in increased brightness thereof.

According to an example of an embodiment, a substrate assembly for an LED assembly can comprise a substrate and a plurality of cups formed in the substrate. At least one cup can be formed within another cup. The substrate can comprise a material that has a shiny or reflective surface when machined. The substrate can comprise a material that has good heat conduction. Thus, the substrate can comprise a metal. Non-metal substrates can also be used. The substrate can comprise aluminum, copper, aluminum nitride (AlN), ceramic, and/or FR4, for example.

The cups (as well as other surfaces of the substrate) can be formed so as to be substantially reflective. In this manner, light from LED die/dice that is incident upon a surface of the cup can be reflected therefrom and can contribute to the brightness of the LED assembly. Forming the cups by machining, such as milling, tends to assure that the resulting surfaces are smooth and reflective.

However, other methods for forming the cups can also be suitable. For example, the cups can be formed by laser drilling or chemical etching. The cups can then be machined, polished, coated, or otherwise processed to provide a reflective surface thereof.

The cups can be generally co-axial with respect to one another. Any desired number of cups can be formed at any desired location within other cups. For example, two cups, three cups, four cups, or more cups, can be formed one within another.

One or more of the cups can be round. One or more of the cups can be non-round, e.g., square. The cups can have any desired shape of combination of shapes. For example, the first or outer cup can be round and the second or inner cup can be square.

The cups can have either sloped or non-sloped walls. Generally, sloped walls can provide better reflection of light out of a cup. The floors and/or the walls of the cups can remain bare, e.g., uncoated, so as to enhance the reflectivity thereof. Any coatings applied to the walls can be transparent or reflective, so as to enhance the reflectivity thereof.

As discussed below, a dielectric layer can be formed upon at least a portion of the substrate. A conductive layer, e.g., a metal layer, can be formed upon the dielectric layer. A solder mask can be formed upon the metal layer to facilitate the application of solder thereto. The solder mask can be transparent.

The solder mask can be a non-global. For example, the solder mask can be a local solder mask that is formed upon the metal layer substantially only at those locations where a solder mask is required to prevent the application of solder. Thus, the solder mask can be formed only proximate where the application of solder is desired, such as proximate the contact pads and/or proximate where the LED die/dice are wire bonded to the metal layer.

The solder mask can be any desired combination of non-global and transparent. Thus, the solder mask can be both non-global and transparent.

The use of cups, such as two or more generally co-axial cups, can negate the need for a ring. As those skilled in the art will appreciate, such rings are commonly used according to contemporary practice to contain layers of material that are applied over the LED die/dice. For example, such rings can be used to facilitate the application of a clear silicone and/or a phosphor layer.

One or more cups can contain the layer or layers of material that are applied over the LED die/dice. For example, the cup or cups can be used to facilitate the application of any desired number of clear silicone and/or a phosphor layers. Thus, the use of cups can eliminate the need for such contemporary rings. However, a ring can be used in combination with a cup or machined surface of the substrate, if desired.

According to an example of an embodiment, a method for fabricating an LED assembly can comprise machining a first cup in a substrate and machining a second cup within the first cup. Thus, the LED assembly can comprise a plurality of generally co-axial cups, for example.

According to an example of an embodiment, an LED assembly can comprise a substrate having a machined surface upon which at least one LED die can be attached. The machined surface can be shiny or reflective such that light incident thereon from the LED die/dice. The machine surface can define a cup or can not define a cup.

One or more cups can be formed in the machined surface. Any surface of a cup can be machined. Any desired combination of machined surfaces and cups can be used.

According to an example of an embodiment, a method for fabricating an LED assembly can comprise machining a surface of a substrate. Such machining can enhance the reflectivity of the substrate and can thus increase the brightness of an LED assembly by mitigating undesirable light absorption.

One or more LED die can be attached to the machined surface. Any desired number of LED die/dice can be attached to or proximate a machined surface so as to enhance the brightness of an LED assembly. For example, an array of LED die can be attached to the machined surface. The array can comprise two LED dice, four LED dice, eight LED dice, or any other number of LED dice.

Figure 2:
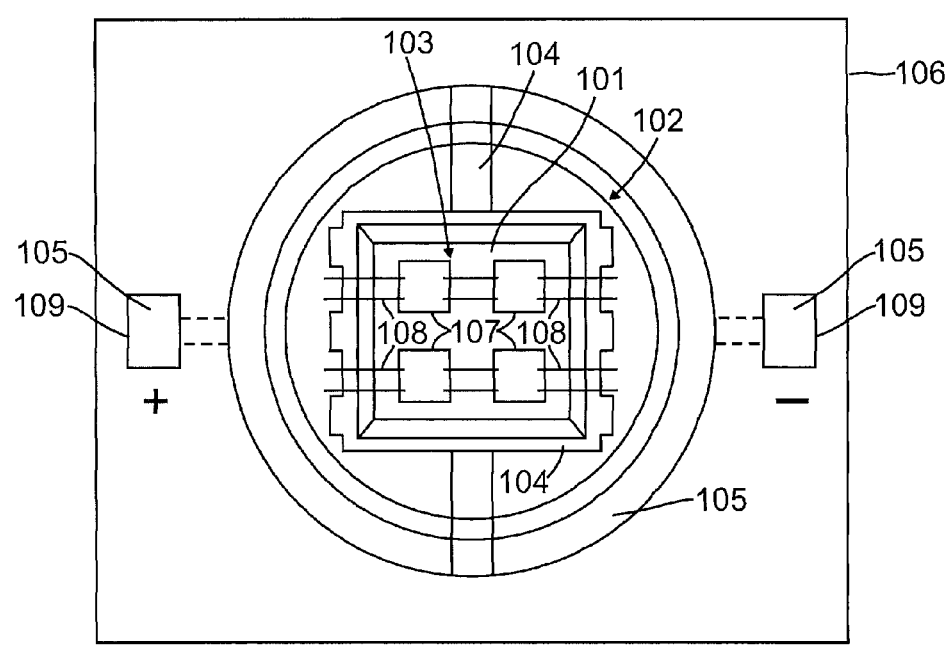
FIG. 2 is a semi-schematic, top view of an LED assembly, such as that of FIG. 1, according to an example of an embodiment.

Referring now to FIGS. 1 and 2, a light emitting diode (LED) assembly can comprise a plurality of cups, according to an example of an embodiment. More particularly, a substrate 101 can have a first cup 102 formed therein and can have a second cup 103 formed in the first cup 102. The second cup 103 can be formed in the floor of the first cup 102. The first cup 102 can be generally circular in shape (as shown) and the second cup 103 can be generally square in shape (as shown). The first cup 102 and the second cup 103 can be co-axially disposed with respect to one another (as shown).

Alternatively, the first cup 102 can be non-circular and/or the second cup 103 can be non-square. The first cup 102 and the second cup 103 can be non-coaxially disposed with respect to one another. For example, the first cup 102 and/or the second cup 103 can be oval, triangular, square, rectangular, or octagonal. The first cup 102 and/or the second cup 103 can have any desired shape. The first cup 102 and the second cup 103 can have the same shape or can have a different shape with respect to one another. Indeed, the first cup 102 and/or the second cup 103 can have any desired combination of shapes.

As a further example, the first cup 102 and/or the second cup 103 can be off center or eccentric with respect to one another (such as when viewed from above). The second cup 102 can be disposed at any desired position within the first cup 102. Thus, the second cup 102 can be disposed proximate a wall of the first cup.

Indeed, any desired number of cups may be disposed one within another. Thus, examples of embodiments can comprised one, two, three, four, five, six, seven, eight, or more cups that are disposed one within another. Other examples of embodiments can comprise a single cup.

Indeed, any desired number of cups may be disposed within a given cup. Thus, examples of embodiments can comprised one, two, three, four, five, six, seven, eight, or more cups that are disposed a single cup.

A given cup can have any desired number or configuration of cups disposed therein. For example, a given cup can have four cups disposed side-by-side (as opposed to on within another) therein. Thus, a two-dimensional array of cups can be formed within a cup. The cups within a given cup can have the same shape or different shapes.

One or more LED die can be disposed within the second cup 103. Any desired number of LED die in any desired configuration can be disposed within second cup 103. The first cup can have one or more LED die disposed therein.

Each cup can have the same number or a different number of LED die disposed therein. For example, two cups can be disposed within another cup and each of the two cups can have a different number of LED die disposed therein.

The substrate 101 can comprise a heat conductive material. For example, the substrate 101 can comprise metal. The substrate 101 can comprise a single metal or any desired combination of metals.

The substrate 101 can comprise a non-metal. Examples of materials suitable for use as the substrate include aluminum, copper, aluminum nitride (AlN), ceramic, and FR4. As those skilled in the art will appreciate, FR4 is a type of material used for making a printed circuit boards.

A dielectric layer 104 can be formed upon the substrate 101. For example, the dielectric layer can cover substantially all of the top surface of the substrate 101 other than the second cup 103. Typically, the dielectric layer 104 will not be formed upon the walls and floor of the second cup 103.

A metal layer 105 can be formed upon the dielectric layer 104. The metal layer 104 can define separate positive and negative conductors that facilitate current flow to the LED die according to well known principles. The metal layer 105 can define contact pads 109 that facilitate electrical connection between the LED assembly and a power source.

Wire bonds 108 can interconnect the LED dice 107 with the metal layer 105. Wire bonds 108 can interconnect the LED dice 107 in any desire manner. For example, wire bonds 108 can interconnect the LED dice 107 in any desired combination of parallel and serial.

The bottom of the second cup 103 and the walls of the second cup can be reflective. The first cup 102 and the second cup 103 can be formed by machining such that the surfaces thereof are smooth and reflective. For example, the first cup 102 and the second cup 103 can be drilled, milled, and/or punched into the substrate 101. As those skilled in the art will appreciate, the use of machining provides a smooth surface that is substantially reflective for light from the LED dice 107.

FIGS. 3 to 16 show methods for forming LED assemblies according to examples of embodiments. The various features of LED assemblies shown in FIGS. 2 to 16, as well as those shown in FIGS. 1 and 2, can be combined with one another, as desired. For example, any desired combination of cups, machined surfaces, transparent rings, transparent solder masks, and non-global solder masks can be use to fabricate embodiments.

Figure 3:
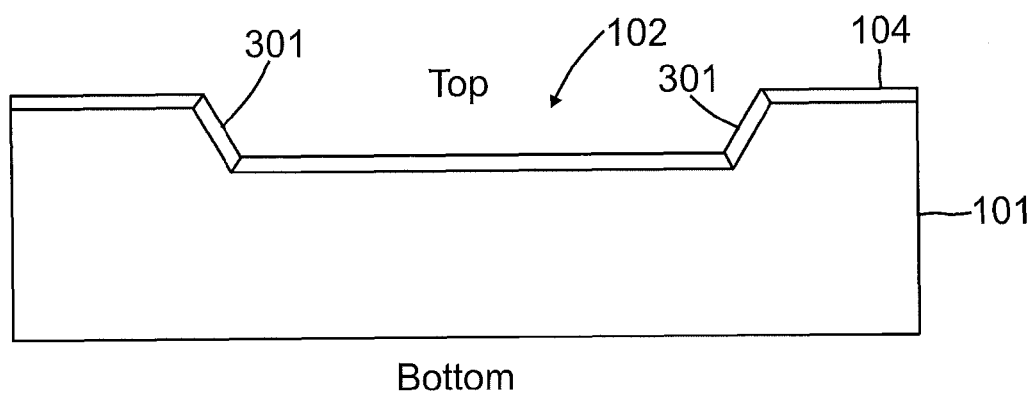
FIG. 3 is a semi-schematic, cross-sectional, side view of a substrate having a first cup formed therein and having a dielectric formed thereon, as can be used in the fabrication of an LED assembly such as the LED assembly of FIGS. 1 and 2, according to an example of an embodiment.

Referring now to FIG. 3, a substrate 101 can have a first cup 102 formed therein. A dielectric 104 can be formed on the substrate 101. The first cup 102 can be formed by drilling, as discussed above. The dielectric layer 104 can be grown globally, e.g., over substantially the entire top surface of the substrate 101.

The dielectric layer 104 can cover that portion of the substrate 101 that does not define the first cup 102 and can cover the floor of the first cup 102. The dielectric layer 104 can be omitted from the sloped side 301 of the first cup 102. Alternatively, the dielectric 104 can cover the sloped side 301 of the first cup 102.

The dielectric layer 104 can be formed by anodizing or printing, for example. The dielectric layer 104 can be formed by any desired method.

Figure 4:
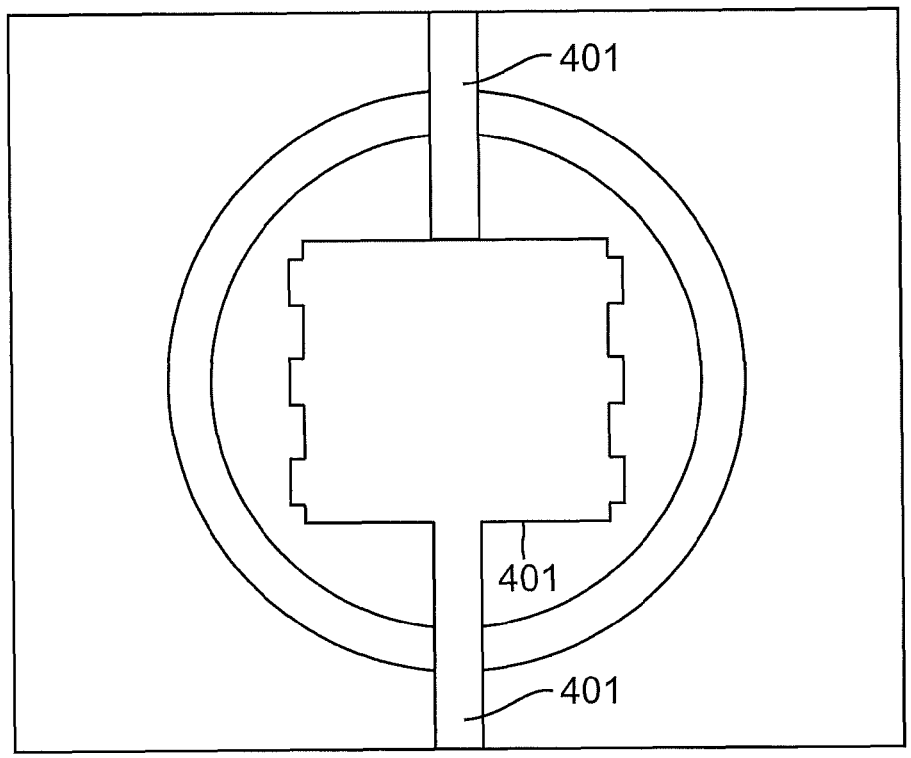
FIG. 4 is a semi-schematic, top view of a substrate, such as that of FIG. 3, additionally having a mask formed upon the top surface thereof, according to an example of an embodiment.

Referring now to FIG. 4, a mask 401 can be formed upon the top surface of the substrate 101 such that the mask 401 covers a portion of the dielectric layer 401. The mask 401 can also cover a portion of the substrate 101 where there is no dielectric layer 104. For example, the mask 401 can cover a portion of the sloped sides 301 of the first cup 102.

The mask 401 can define an area where the metal layer 105 is not deposited. The mask 401 can split the top surface of the LED assembly into two portions that are isolated from one another. Thus, the mask 401 can facilitate the formation of separate positive and negative conductors as defined by the metal layer 105. The positive and negative conductors can facilitate electrical connection to the LED dice 107, as discussed above.

Figure 5:
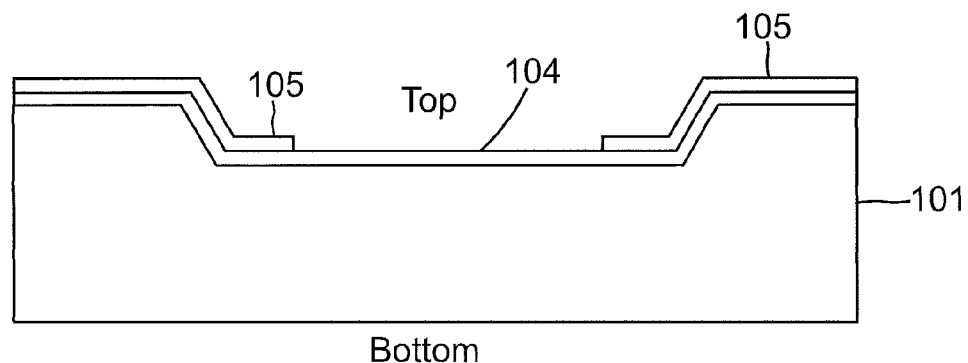
FIG. 5 is a semi-schematic, cross-sectional, side view of a substrate, such as that of FIG. 4, additionally having an adhesion layer, a seed layer, and a copper layer formed thereon and having the mask removed therefrom, according to an example of an embodiment.

Referring now to FIG. 5, an adhesion layer and a seed layer can be formed upon the top surface of the substrate 101, such as upon the dielectric layer 104 thereof. The adhesion layer and a seed layer can be formed upon a portion of the sloped side 301 of the first cup 102, where no dielectric layer 104 is formed.

The adhesion layer and a seed layer can facilitate the formation of a copper layer thereupon. The adhesion layer, the seed layer, and the copper layer can be formed according to well know principles. The copper layer can be electroplated upon the seed layer. A layer of silver (Ag), gold (Au) or aluminum (Al) can be deposited upon the copper layer. The silver/gold/aluminum layer can define the metal layer 105. The metal layer 105 can comprise any metal or combination of metals.

The mask 401 can be stripped. Stripping the mask can leave the dielectric layer 104 exposed where the mask 401 had previously been formed. Any desired method can be used for stripping the mask 401.

Figure 6:
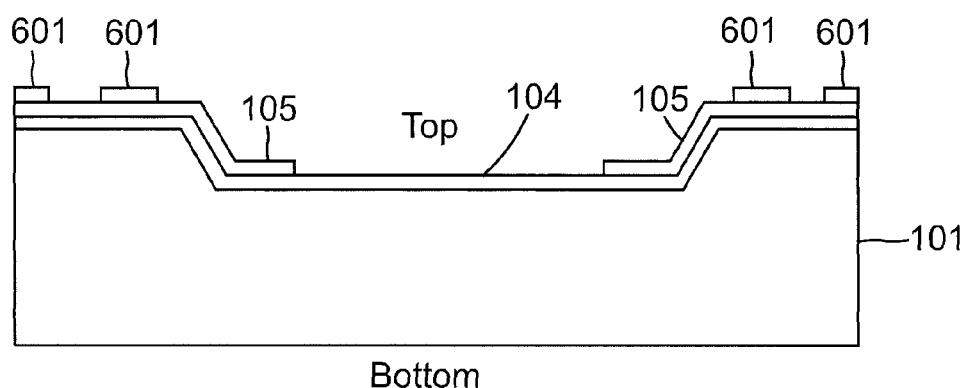
FIG. 6 is a semi-schematic, cross-sectional, side view of a substrate, such as that of FIG. 5, additionally having a transparent solder mask formed upon a top surface thereof, according to an example of an embodiment.

Referring now to FIG. 6, a transparent solder mask 601 can be formed upon a top surface of the LED assembly, such as upon the metal layer 105 thereof. The solder mask can define exposed portions of the top surface of the LED assembly where solder is to be applied. The solder can be used to facilitate electrical connections, as discussed herein.

Figure 7:
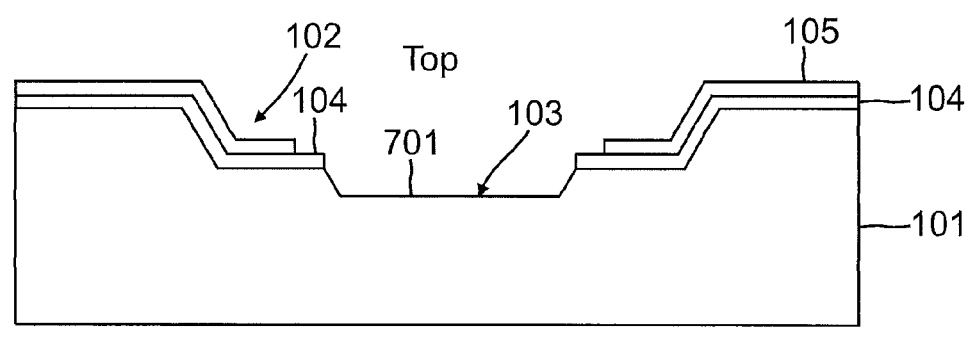
FIG. 7 is a semi-schematic, cross-sectional, side view of a substrate, such as that of FIG. 6, additionally having a second cup formed therein, according to an example of an embodiment.

Referring now to FIG. 7, a second cup 103 can be formed in the substrate 101. The second cup 103 can be formed generally co-axially with respect to the first cup 102. The second cup 103 can be square in shape (as shown in FIG. 2, for example). The second cup can be formed by machining. The bare metal surface 701 at the bottom of the second cup 103 can remain exposed. This bare metal surface 701 is reflective and provides a good interface for heat conduction from the LED dies to the substrate 101.

Generally, machining provides a smoother, more reflective surface as compared to etching. Etching can be used to form the first cup 102 and the second cup 103. If etching is used to form the first cup 102 and second cup 103, then additional processing can be used to make the resulting surfaces smoother and more reflective. For example, the surfaces can be machined, polished, and/or coated after etching to make the surface smoother and more reflective.

Figure 8:
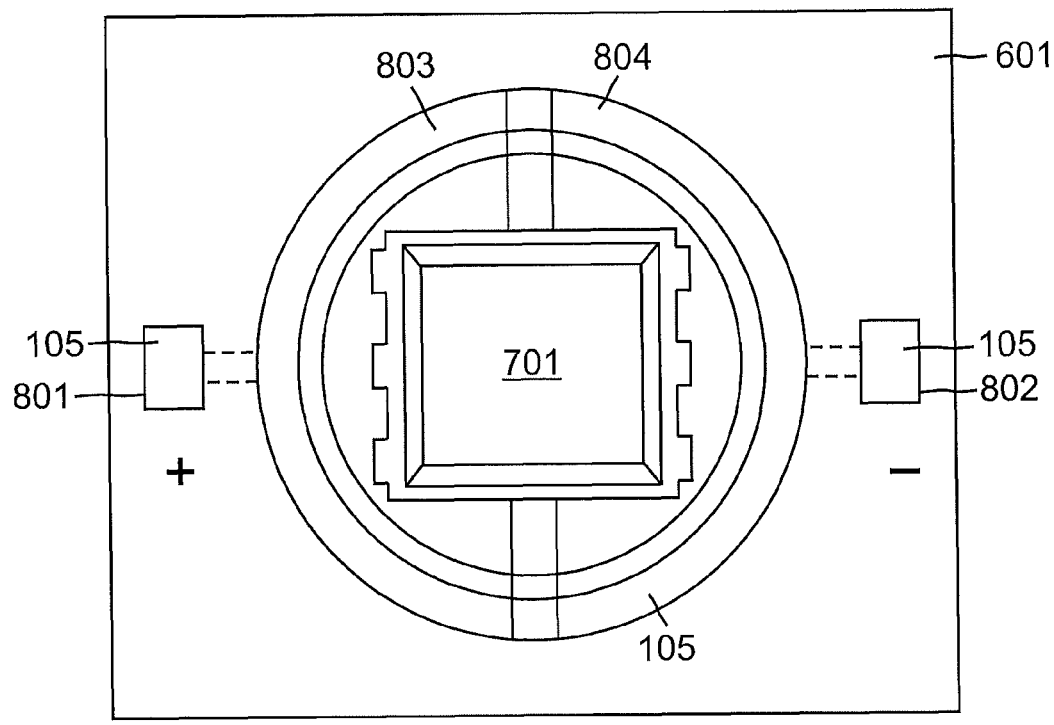
FIG. 8 is a semi-schematic, top view of a substrate, such as that of FIG. 7, showing the solder mask and the conductive layer formed upon the top surface thereof, according to an example of an embodiment.

Referring now to FIG. 8, the solder mask 601 and the conductive layer 106 can be seen in a top view. The conductive layer 105 can define two separate portions that define a positive conductor and a negative conductor. The positive conductor can comprise an exposed positive contact pad 801 that is in electrical communication with exposed portion 803 of the conductive layer 105 to facilitate electrical connection to the LED die as discussed herein. Similarly, the positive conductor can comprise an exposed positive contact pad 802 that is in electrical communication with exposed portion 804 of the conductive layer 105 to facilitate electrical connection to the LED die as discussed herein.

Figure 9:
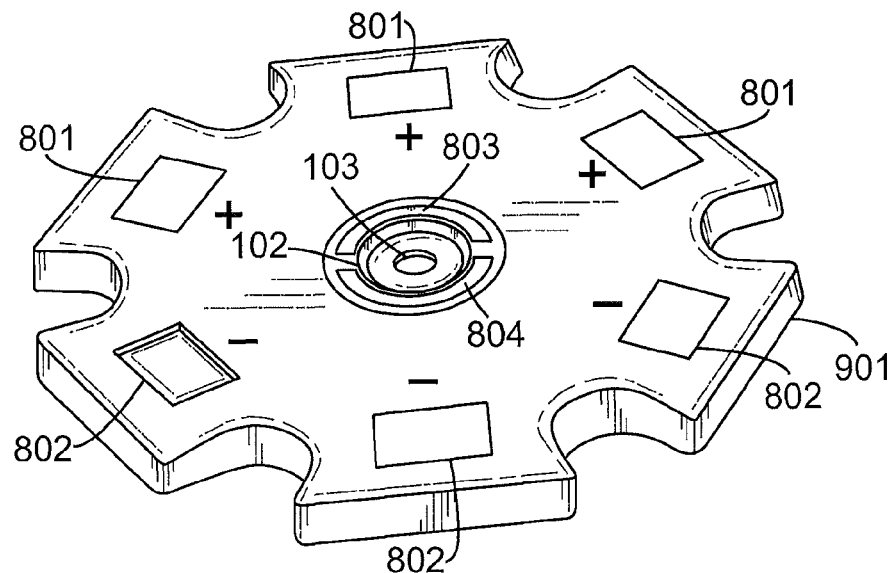
FIG. 9 is a semi-schematic, perspective view of another configuration of a substrate for use in an LED assembly wherein a non-square substrate is used, according to an example of an embodiment.

Referring now to FIG. 9, the substrate 901 can have any desired shape or configuration. Further, any desired number of positive contact pads 801 and negative contact pads 802 can be used. A first cup 102 and a second cup 103 can be formed generally centrally in the substrate.

Thus, the substrate 901 can have a generally star shaped configuration, as shown in FIG. 9. Such a star shaped configuration can better facilitate handling and mounting of the substrate, as compared to the square substrate of FIG. 2.

Figure 10:
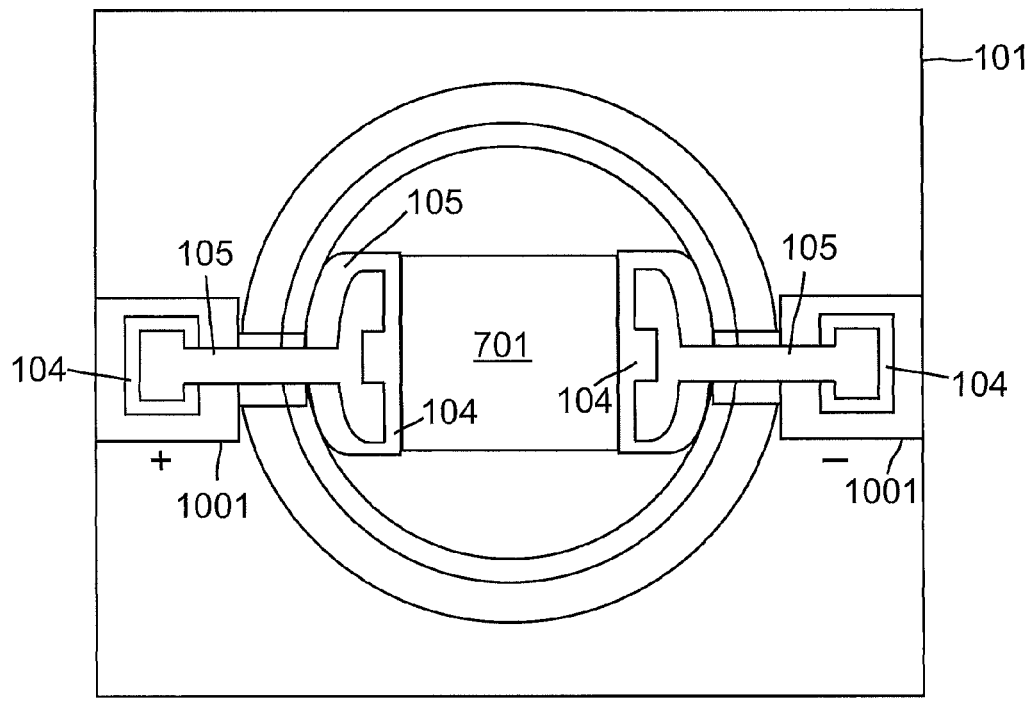
FIG. 10 is a semi-schematic, top view of another configuration of a substrate for use in an LED assembly wherein a local solder mask (as opposed to the global solder mask of FIG. 8) is used, according to an example of an embodiment.

Referring now to FIG. 10, a non-global, e.g., local, solder masks 1001 (as opposed to the global solder mask of FIG. 8) can be formed. Such local solder masks 1001 can be applied only in those areas where required so as to prevent solder from being applied to the substrate 101. In this manner, the amount of solder mask tends to be minimized. As those skilled in the art will appreciate, a solder mask can become yellowish after long-time LED lighting, thus making the LED color shifted.

The solder mask can be transparent, so as to mitigate undesirable light loss. A transparent solder mask can be used either globally or non-globally. The local solder masks 1001 can be transparent, translucent, or opaque.

Figure 11:
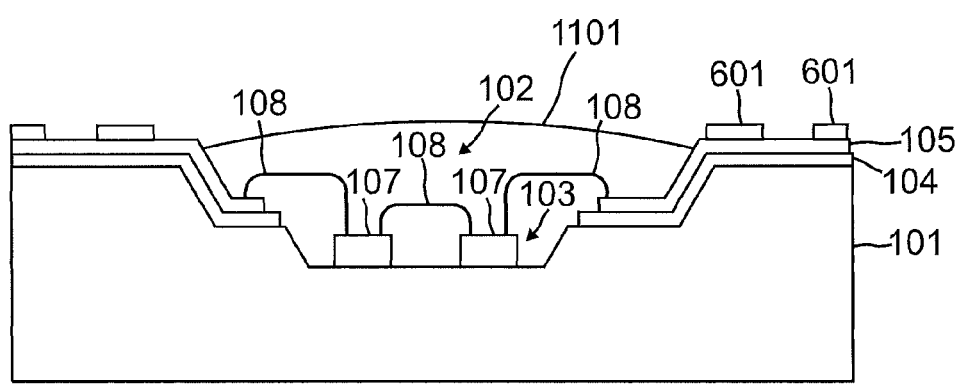
FIG. 11 is a semi-schematic, cross-sectional, side view of a substrate, such as that of FIGS. 7 and 8, additionally having a plurality of LED die disposed in the second cup thereof and having a phosphor layer formed over the LED die, according to an example of an embodiment.

Referring now to FIG. 11, a plurality of LED dice 107 can be disposed in the second cup 103. A phosphor layer 1101 can be formed over the LED dice 107. As those skilled in the art will appreciate, such a phosphor layer 1101 can be used to change the color of light emitted by the LED dice 107.

Use of the first cup 102 and the second cup 103 can facilitate the fabrication of an LED assembly having such a phosphor layer without the use of a ring. As those skilled in the art will appreciate, contemporary LED assemblies can use a ring to contain the phosphor layer. As shown in FIG. 11, the phosphor layer 1101 can be contained within the first cup 102 and the second cup 103.

As those skilled in the art will further appreciate, elimination of the ring simplifies fabrication, improves reliability, and can substantially reduce cost. The use of a ring involves not only the added cost of the ring itself, but also the cost of purchasing and maintaining the machine that places the ring upon the substrate. Such rings can be small and difficult to handle, even for automated processes. Such rings can bow or otherwise deform undesirably during fabrication, making handling difficult. The use of such rings decreases yield undesirably.

Figure 12:
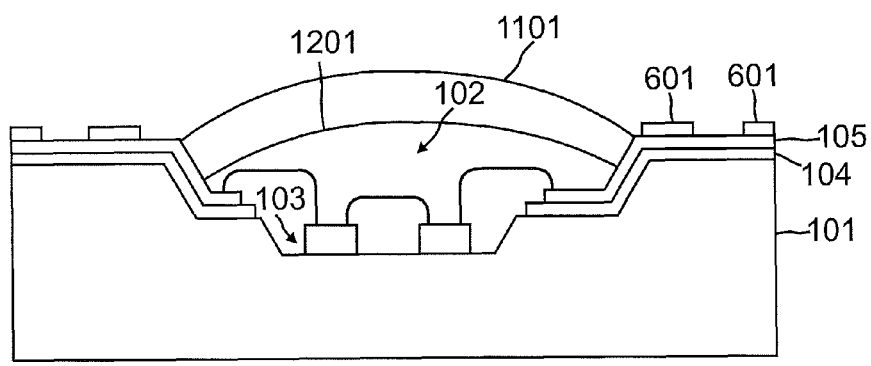
FIG. 12 is a semi-schematic, cross-sectional, side view of a substrate, such as that of FIGS. 7 and 8, additionally having a plurality of LED die disposed in the second cup thereof and having a clear silicone layer and a phosphor layer formed over the LED die, according to an example of an embodiment.

Referring now to FIG. 12, a clear silicone layer 1201 and a phosphor layer 1101 can be formed over the LED dice 107. Any desired number and/or configuration of silicon layers and phosphor layer can be formed over the LED dice 107. Thus, more than one layer of silicon and/or more than one layer of phosphor can be used.

The use of the first cup 102 and the second cup 103 can eliminate the used of a ring, as discussed above. Thus, a ring is not required to contain the clear silicone layer 1201 and/or the phosphor layer 1101.

The silicon layer(s) and/or the phosphor layer(s) can be bowed upwardly as shown in FIGS. 11 and 12. Alternatively, the silicon layer(s) and/or the phosphor layer(s) can have any other desired shape or configuration. For example, the silicon layer(s) and/or the phosphor layer(s) can be generally flat as shown in FIG. 13 and discussed below or can be irregularly shaped as shown in FIG. 14 and discussed below.

Figure 13:
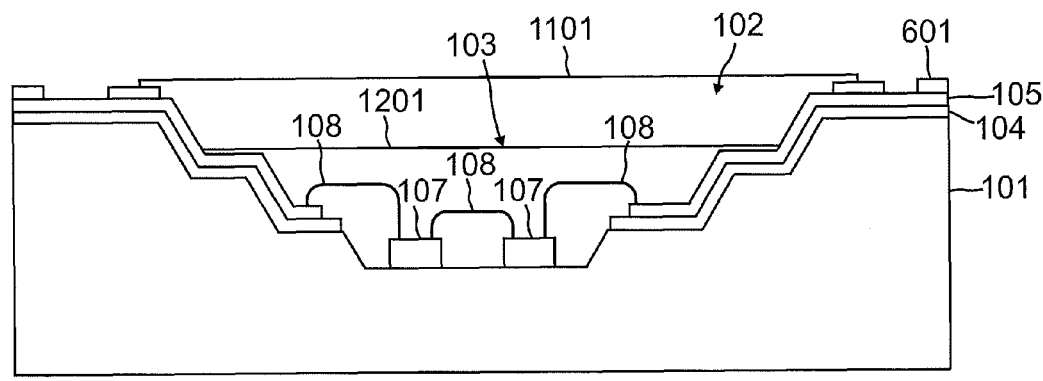
FIG. 13 is a semi-schematic, cross-sectional, side view of a substrate having three cups, having a plurality of LED die disposed in the third cup thereof, having a clear silicone layer formed over the LED die, and having a phosphor layer formed silicone layer, according to an example of an embodiment.

Referring now to FIG. 13, a generally flat phosphor layer 1101 can be formed upon a generally flat clear silicone layer 1201. Any desired combination of surface configurations can be used. For example, one layer, e.g., the silicone layer, can be substantially flat and the other layer, e.g., the phosphor layer, can be non-flat.

Figure 14:
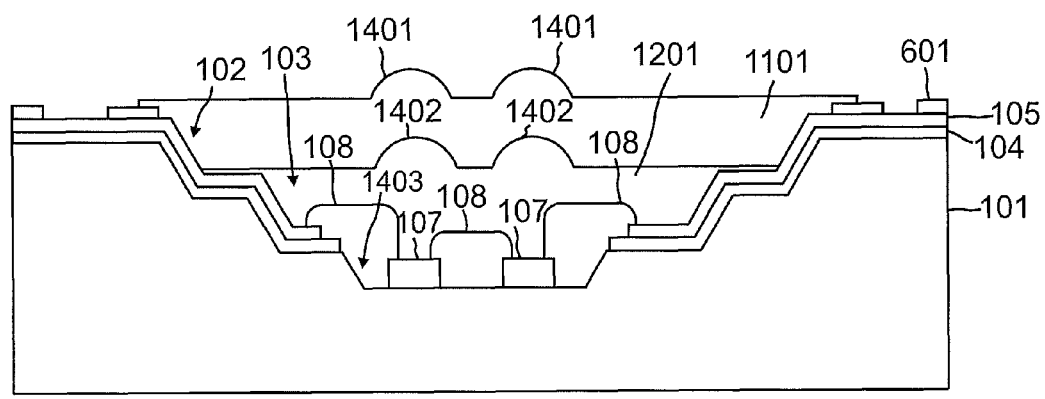
FIG. 14 is a semi-schematic, cross-sectional, side view of a substrate having three cups, a plurality of LED die disposed in the third cup thereof, having a clear silicone layer formed over the LED die, and having a phosphor layer formed silicone layer, wherein individual lenses are formed in the silicone layer and the phosphor layer, according to an example of an embodiment.

Referring now to FIG. 14, the substrate 102 can have three cups formed therein. Indeed, as discussed herein, the substrate 102 can have any desired number of cups formed therein. Thus, a third cup 1403 can be formed within a second cup 103 and the second cup 103 can be formed within the first cup 102. A plurality of LED die 107 can be disposed in the third cup 1403.

A clear silicone layer 1201 can be formed over the LED dice 107 and a phosphor layer 1101 can be formed over the silicone layer 1201. The silicone layer 1201 and/or the phosphor layer 1101 can have irregularly shaped surfaces. For example, individual lenses 1402 can be formed in the silicone layer 1201. Similarly, individual lenses 1401 can be formed in the phosphor layer 1101.

Figure 15:
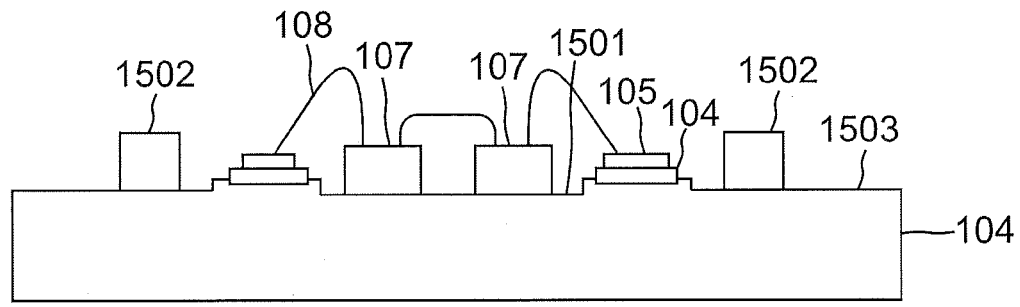
FIG. 15 is a semi-schematic, cross-sectional, side view of a substrate having a single shallow cup or machined surface formed thereon and having a transparent ring surrounding a plurality of LED die disposed upon the machined surface, according to an example of an embodiment.
Figure 16:
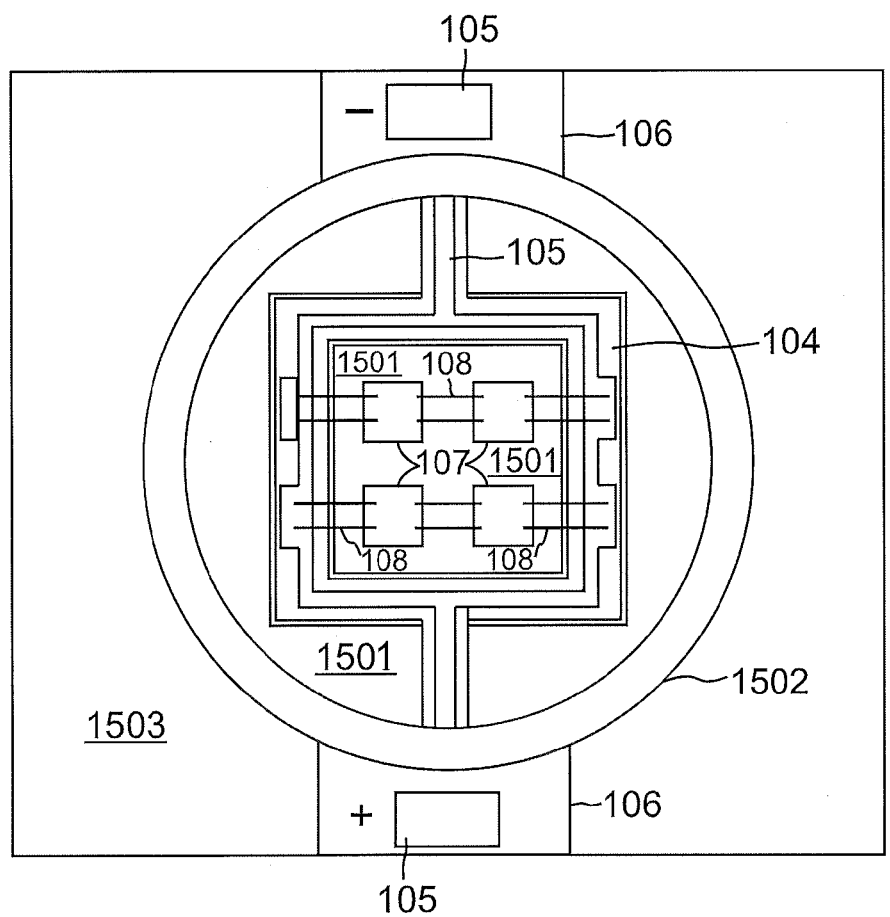
FIG. 16 is a semi-schematic, top view of a substrate having a transparent ring surrounding a plurality of LED die disposed upon the machined surface thereof, such as that of FIG. 15, according to an example of an embodiment.

Referring now to FIGS. 15 and 16, a single shallow cup or machined surface 1501 can be formed upon the substrate 104. The machined surface can provide a desirably clean, reflective, and heat transmissive surface. Such cleanliness can better facilitate further processing, e.g., the attachment of an LED die 107 thereto. Such reflectivity can facilitate more efficient, e.g., brighter, LED assemblies. Such heat transmission can facilitate enhance heat flow from the LED dice 107 to the substrate 101.

A ring 1502 can generally surround the plurality of LED dice 107 disposed upon the machined surface 1501. The ring 1502 can be substantially transparent. The ring 1502 can facilitate the use of a clear silicone layer and/or a phosphor layer (like those of FIGS. 11-14).

Other portions of the substrate 101 can be machined. For example, surface 1503 can be machined. Machining of such other surfaces, e.g., surface 1503, can provide enhance reflectivity and thus improve efficiency of the LED assembly.

Any desired number of machined surfaces can be formed upon the substrate 101. Any desired combination of machined surfaces, cups, and/or rings can be used.

Figure 17:
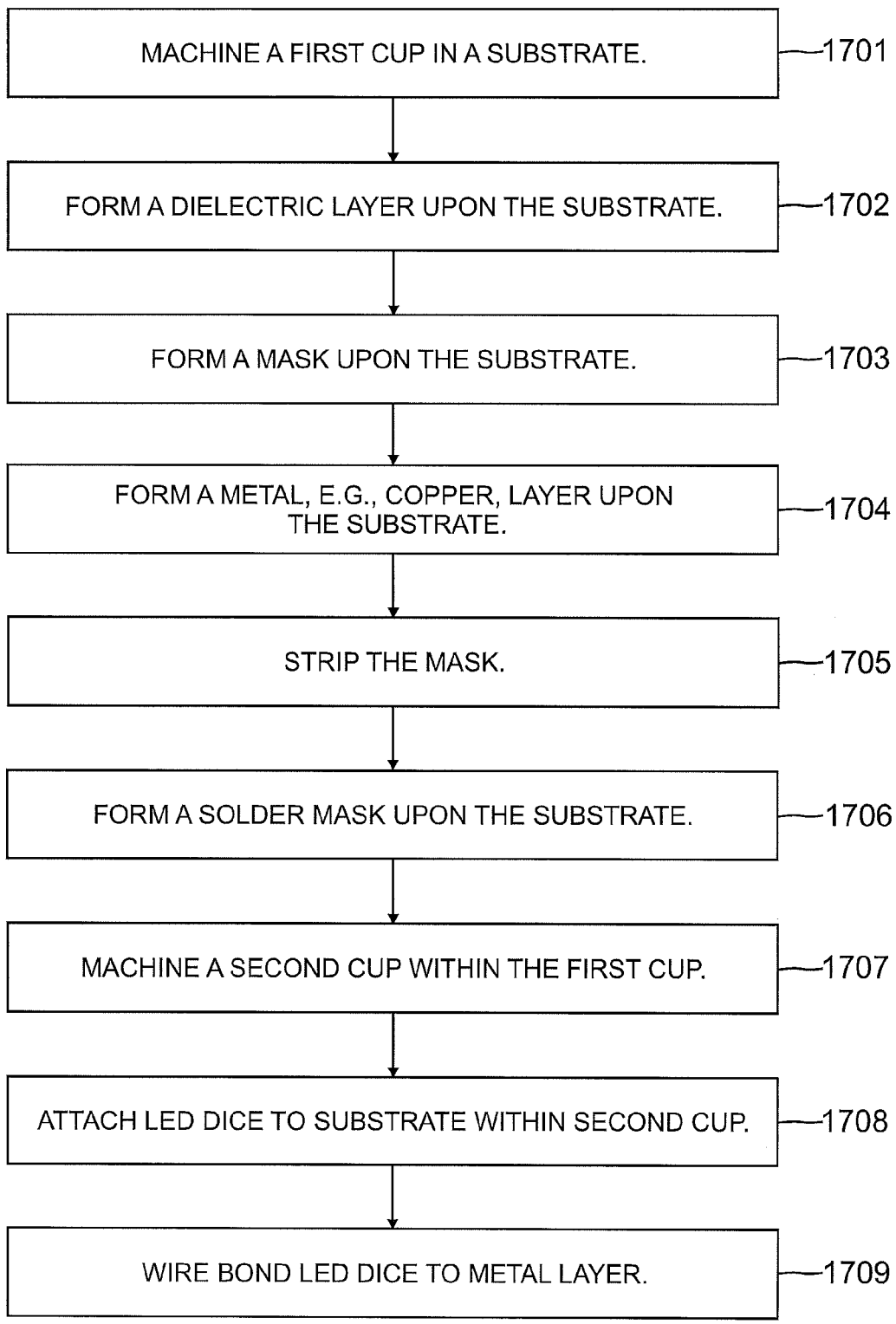
FIG. 17 is a flow chart showing a method for fabricating an LED assembly, such as that of FIGS. 1 and 2, according to an example of an embodiment.

Referring now to FIG. 17, a method for fabricating an LED assembly can comprise machining a first cup (such as cup 102 of FIGS. 1 and 2) into a substrate (such as substrate 101 of FIGS. 1 and 2), as indicated in block 1701. The first cup can be milled into the substrate.

A dielectric layer can be formed upon the substrate, as indicated in block 1702. The dielectric layer can be formed generally globally upon the substrate. The dielectric layer can be omitted from the side walls (such as the sloped side wall 301 of FIG. 3) of the cup. The dielectric layer can be formed by anodizing, cofiring, laminating, printing, or any other desired method.

A mask (such as mask 401 of FIG. 4) can be formed upon the substrate, as indicated in block 1703. The mask facilitates the subsequent formation of a metal layer only upon desired portions of the substrate. The mask can prevent the positive conductor and negative conductor defined by the metal layer from undesirably contacting one another. The mask can include at least a portion of the floor or bottom of the cup. The mask can comprise adhesive tape.

A metal layer can be formed upon the substrate, as indicated in block 1704. An adhesion layer, such as of nickel/chromium/titanium (Ni/Cr/Ti), and a seed layer can facilitate formation of the metal layer according to well known principles. Copper can be electroplated onto the substrate. Following the application of copper, silver and/or gold can be applied to define the metal layer.

After forming the metal layer, the mask can be removed or stripped, as indicated in block 1705. Then, a solder mask can be formed upon the substrate, as indicated in block 1706. The solder mask can facilitate the application of a solder layer to the substrate. The solder layer can be used to facilitate electrical connection of the LED die/dice to the metal layer and electrical connection of the metal layer (and thus the LED assembly) to the device in which it is use, e.g., a flashlight or room light.

A second cup can be formed in the substrate within the first cup, as indicated in block 1707. The second cup can be formed by the same method as the first cup or can be formed by a different method. The second cup can have the same shape as the first cup, or can have a different shape (see, for example, the round first cup and the square second cup of FIG. 8).

One or more LED die/dice can be attached to the substrate within the second cup, as indicated in block 1708. Any desired number of LED die/dice can be attached to the substrate. Any desired method for attaching the LED die/dice to the substrate can be used. For example, the LED die/dice can be reflow soldered to the substrate.

The LED die/dice can be wire bonded to the metal layer, as indicated in block 1709. Any desired method of electrically connecting the LED die/dice can be used.

Figure 18:
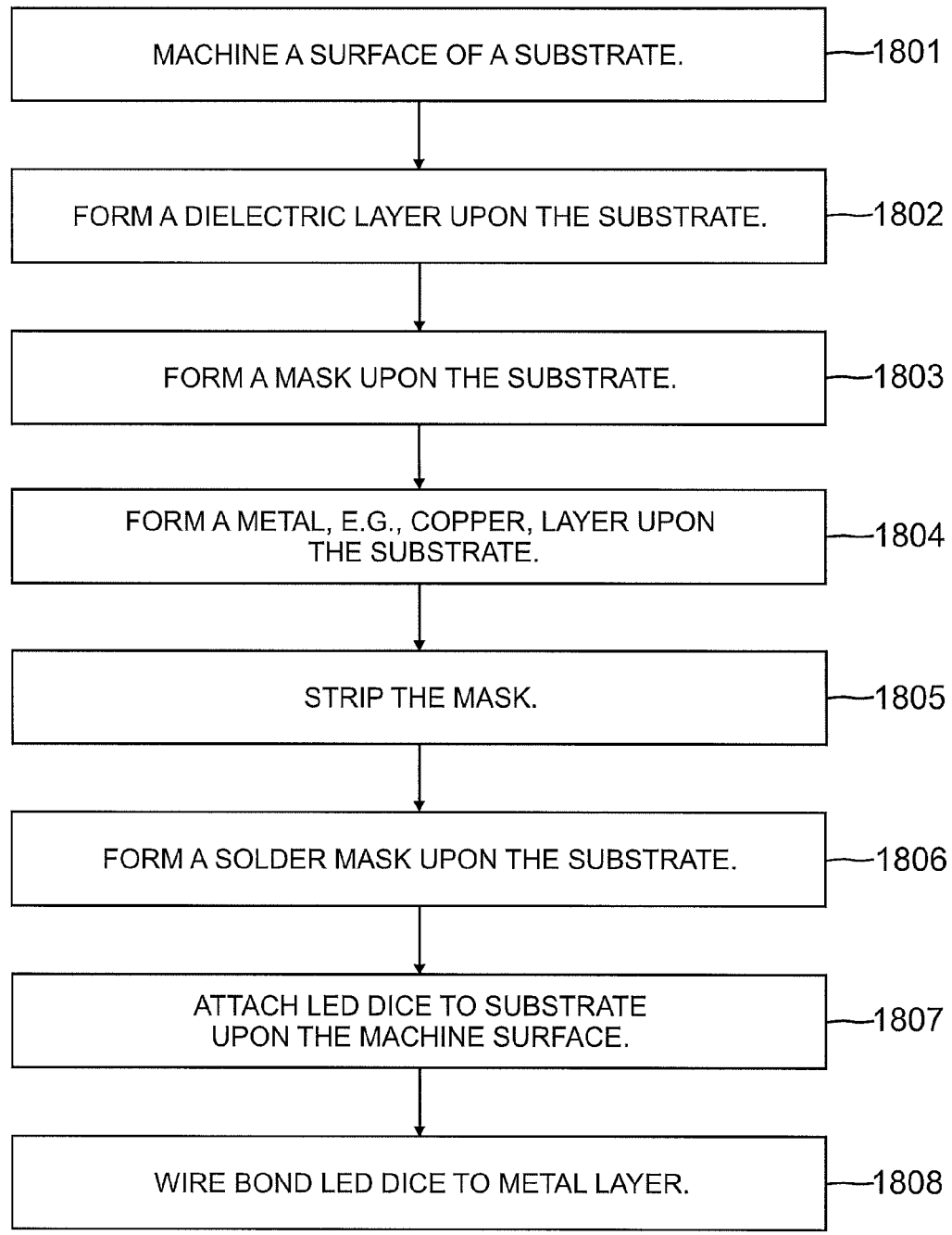
FIG. 18 is a flow chart showing a method for fabricating an LED assembly, such as that of FIGS. 15 and 16, according to an example of an embodiment.

Referring now to FIG. 18, another method for fabricating an LED assembly can comprise machining a surface (such as machined surface 1501 of FIGS. 15 and 16) into a substrate, as indicated in block 1801. For example, the surface can be milled into the substrate.

A dielectric layer can be formed upon the substrate, as indicated in block 8702. The dielectric layer can be formed generally globally upon the substrate. The dielectric layer can be formed by anodizing, printing, or any other desired method.

A mask (such as mask 401 of FIG. 4) can be formed upon the substrate, as indicated in block 1803. The mask facilitates the subsequent formation of a metal layer only upon desired portions of the substrate. The mask can prevent the positive conductor and negative conductor defined by the metal layer from undesirably contacting one another. The mask can comprise adhesive tape.

A metal layer can be formed upon the substrate, as indicated in block 1804. An adhesion layer, such as of nickel/chromium/titanium (Ni/Cr/Ti), and a seed layer can facilitate formation of the metal layer according to well known principles. Copper can be electroplated onto the substrate. Following the application of copper, silver and/or gold can be applied to define the metal layer.

After forming the metal layer, the mask can be removed or stripped, as indicated in block 1805. Then, a solder mask can be formed upon the substrate, as indicated in block 1806. The solder mask can facilitate the application of a solder layer to the substrate. The solder layer can be used to facilitate electrical connection of the LED die/dice to the metal layer and electrical connection of the metal layer (and thus the LED assembly) to the device in which it is use, e.g., a flashlight or room light.

One or more LED die/dice can be attached to the substrate upon the machined surface, as indicated in block 1807. Any desired number of LED die/dice can be attached to the substrate. The machined surface facilitates enhanced reflection of light form the LED die/dice so as to enhance the brightness of the LED assembly.

The LED die/dice can be wire bonded to the metal layer, as indicated in block 1808. Any desired method of electrically connecting the LED die/dice can be used.

Thus, one or more rings can be used in combination with one or more cups. For example, a cup can be used to contain a clear silicone layer and a ring can be used to contain a phosphor layer.

In operation, light from the LED die/dice can be better reflected from the substrate so as to provide a brighter LED assembly. More particularly, light incident upon the machined cup(s) and/or machined surface(s) can be better reflected since machining or other processing of the surface(s) make the surface(s) more reflective. Further, limiting the amount of solder mask (as in non-global use thereof) and/or using a transparent solder mask desirably enhances the reflectivity of the substrate because non-transparent solder masks tend to undesirably absorb light from the LED assembly. Further, the use of a transparent ring inhibits the undesirable absorption of light thereby.

The use of cups can provide a better heat path from the LED die/dice to a heat sink, package, device, or other heat dissipating structure. When one or more cups are formed in a substrate, the thickness of the substrate is reduced. Thus, heat from LED die/dice disposed at the bottom of such cup(s) can have a shorter path to a heat dissipating structure. Heat can be better managed or dissipated so that more current can be used with the LED die/dice, resulting in a brighter LED assembly.

As used herein, the term "cup" can refer to a depression or area of lower elevation, as compared to a surrounding or adjacent area.

As used herein, the term "machined surface" can refer to a surface that has been worked with a tool so as to be more reflective, as compared to an unworked area. A cup can be a machined surface and vice-versa. A machined surface can be a depression or area of lower elevation, as compared to a surrounding or adjacent area, but does not have to be.

As used herein "formed upon" can be defined to include deposited, etched, attached, or otherwise prepared or fabricated upon, such as when referring to the forming the various layers.

Similarly, as used herein "on" and "upon" can be defined to include positioned directly or indirectly on or above. Thus, the metal layer can be referred to as being formed upon the substrate even though the dielectric layer is disposed therebetween, for example.

As used herein, the term "package" can be defined to include an assembly of elements that houses one or more LED chips and provides an interface between the LED chip(s) and a power source to the LED chip(s). A package can also provide optical elements for the purpose of directing light generated by the LED chip. Examples of optical elements are lens and reflectors.

As used herein, the term "transparent" can be defined to include the characterization that no significant obstruction or absorption of electromagnetic radiation occurs at the particular wavelength or wavelengths of interest. The term "transparent" can be defined to include the characterization that a significant amount of light can pass through.

One or more embodiments can provide LED assemblies with enhanced heat dissipation, such that more current can be used therewith. One or more embodiments can provide LED assemblies with mitigated light loss. As discussed above, the use of more current in an LED assembly and/or the reduction of light loss in an LED assembly can result in substantially increased brightness thereof. Such increased brightness can facilitated used of the LEDs in applications such as flashlights, displays, and general illumination.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. An LED assembly comprising:
a transparent ring attached to a substrate, wherein the transparent ring facilitates the formation of at least one layer of material upon at least one LED die by containing the material; and
at least one cup formed in the substrate, wherein the transparent ring is attached to the substrate so as to generally surround the at least one cup.

2. The LED assembly as recited in claim 1, wherein the transparent ring enhances light emission from the LED assembly.

3. The LED assembly as recited in claim 1, wherein the transparent ring generally encircles at least one LED die.

4. The LED assembly as recited in claim 1, wherein the transparent ring facilitates the formation of a silicone layer upon at least one LED die by containing the silicone layer.

5. An LED assembly comprising:
a substrate and a transparent ring attached to the substrate, wherein the transparent ring facilitates the formation of a phosphor layer upon at least one LED die by containing the phosphor layer; and
at least one cup formed in the substrate, wherein the transparent ring is attached to the substrate so as to generally surround the at least one cup.

6. A method for fabricating an LED assembly comprising:
attaching a transparent ring to a substrate, wherein the transparent ring facilitates the formation of at least one layer of material upon at least one LED die by containing the material; and
forming at least one cup in the substrate, wherein the transparent ring is attached to the substrate so as to generally surround the at least one cup.

7. A method for fabricating an LED assembly comprising:
attaching a transparent ring to a substrate, wherein the transparent ring facilitates the formation of at least one layer of material upon at least one LED die by containing the material; and
forming a plurality of generally co-axial cups in the substrate, wherein the transparent ring is attached to the substrate so as to generally surround the plurality of generally co-axial cups.

8. A method for fabricating an LED assembly comprising:
attaching a transparent ring to a substrate, wherein the transparent ring facilitates the formation of at least one layer of material upon at least one LED die by containing the material; and
forming a machined surface upon the substrate, wherein the transparent ring is attached to the substrate so as to generally surround the machined surface of the substrate.

9. The LED assembly as recited in claim 1, wherein the at least one cup further comprises a plurality of generally co-axial cups formed in the substrate, and wherein the transparent ring is attached to the substrate so as to generally surround the plurality of generally co-axial cups.

10. An LED assembly comprising:
a transparent ring attached to a substrate, wherein the transparent ring facilitates the formation of at least one layer of material upon at least one LED die by containing the material, and
a machined surface formed upon the substrate, wherein the transparent ring is attached to the substrate so as to generally surround the machined surface of the substrate.

* * * * *